United States Patent

[11] 3,611,154

[72] Inventor Karl-Heinz Kupfer
Huls, Germany

[21] Appl. No. 779,532
[22] Filed Nov. 27, 1968
[45] Patented Oct. 5, 1971
[73] Assignee U.S. Philips Corporation
New York, N.Y.
[32] Priority Dec. 9, 1967
[33] Germany
[31] P 43575

[54] DIODE SWITCHING OF TUNED CIRCUITS WITH BACK-BIAS DERIVED FROM OSCILLATOR RECTIFICATION
4 Claims, 1 Drawing Fig.

[52] U.S. Cl. ........................................................ 325/459,
325/464, 334/15, 334/56
[51] Int. Cl. ........................................................ H03j 3/28,
H03j 5/00
[50] Field of Search ........................................... 325/452,
458, 459, 462, 464, 465, 422; 331/182, 183;
334/11, 15, 47, 56, 58

[56] References Cited

UNITED STATES PATENTS

| | | | |
|---|---|---|---|
| 3,289,123 | 11/1966 | Bomhardt et al. ............ | 334/47 X |
| 3,321,715 | 5/1967 | Bloch ........................... | 331/183 X |
| 3,354,397 | 11/1967 | Wittig........................... | 325/459 |
| 2,936,428 | 5/1960 | Schweitzer ................... | 325/422 X |

*Primary Examiner*—Benedict V. Safourek
*Attorney*—Frank R. Trifari

ABSTRACT: A tuning circuit particularly for a superheterodyne receiver capable of operating within two widely separated frequency ranges by using a single voltage source to bias switching diodes located within electronically tunable frequency selective and oscillator resonant circuits. For operation within a first frequency range, the single bias source only is connected to the switching diodes. For operation within a second frequency range, the single bias source is disconnected from the switching diodes which are then biased into a blocked condition by a voltage of opposite polarity produced from rectifying the oscillator signal through its switching diode. Tuning within either frequency range is implemented by varying the control voltage for variable capacitance diodes within the frequency selective and oscillator circuits. The local oscillator is provided with an additional resonant circuit tuned to frequencies outside of the two frequency ranges to facilitate the effect of the oscillator when the switching diodes are initially disconnected from the single bias source.

PATENTED OCT 5 1971 3,611,154
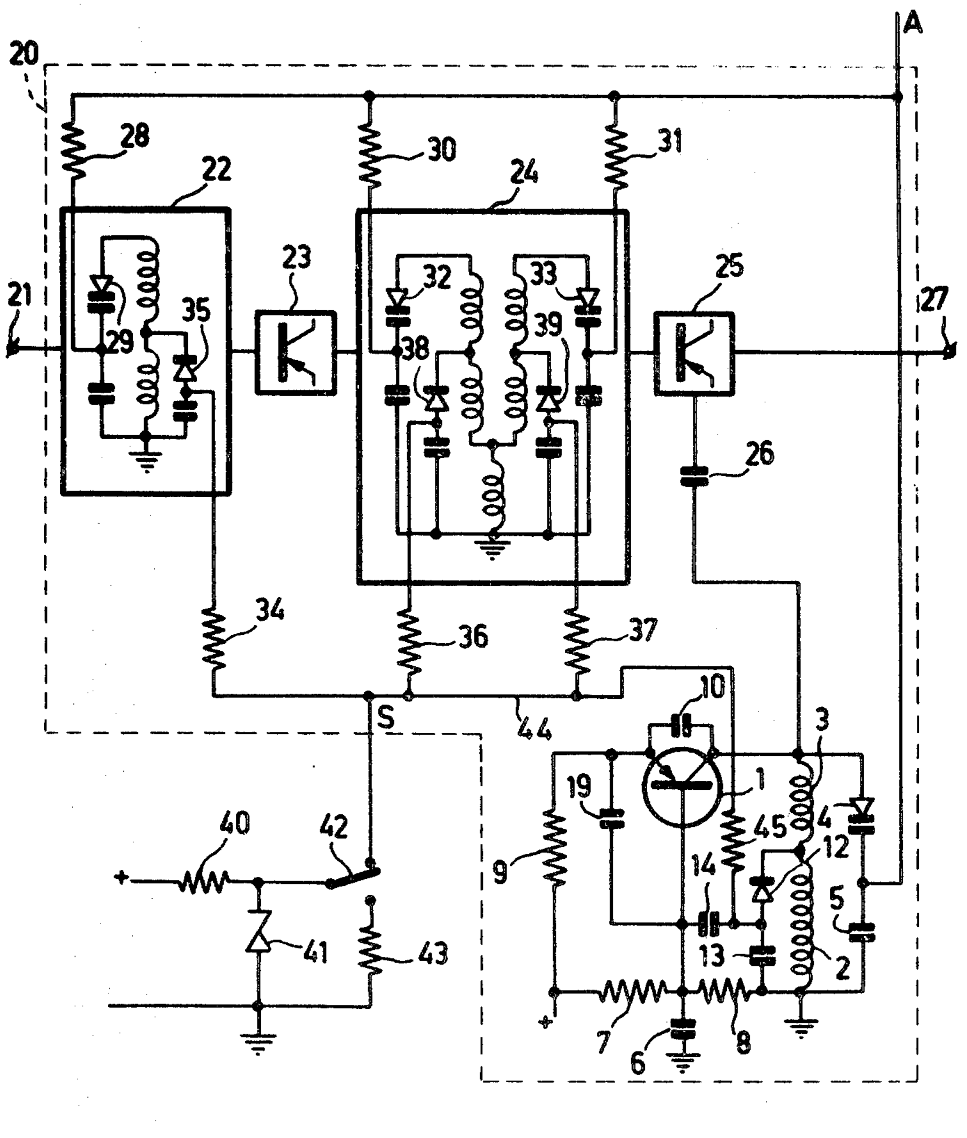
INVENTOR
KARL-HEINZ KUPFER
BY Frank R. Jurfari
AGENT

DIODE SWITCHING OF TUNED CIRCUITS WITH BACK-BIAS DERIVED FROM OSCILLATOR RECTIFICATION

The invention relates to a tuning circuit arrangement for receiving signals located in two frequency ranges in accordance with the superheterodyne principle, one or more resonant circuits which can be tuned to the signal frequencies and an oscillator circuit, which can be tuned and is incorporated in a local oscillator circuit arrangement said circuits including on the one hand variable capacity diodes for tuning the circuits within the frequency ranges and on the other hand switching diodes which serve for changing from one frequency range to the other and which form a conducting connection in one switching condition and are substantially cut off in the other switching condition.

Tuning circuit arrangements of the kind described above are advantageously used since mechanically moving components conveying high frequency are not provided; both the tuning of the resonant circuits within the frequency ranges and the changing from one frequency range to the other are in fact effected wholly electronically.

The switching diodes serving for the range changing must receive a forward voltage upon tuning in the frequency range and a blocking voltage upon tuning in the other frequency range. This means that both a positive and a negative DC voltage must be available for supply to the switching diodes; usually, however, a DC supply voltage of only one polarity is available.

A possible solution may be to provide a potential divider across the available supply voltage source and to derive the reference voltage for the switching diodes from the tapping of the potential divider. In many cases the DC voltage source provides, however, a fairly low DC voltage which is not must higher than the values required for blocking the switching diodes so that it is not satisfactorily possible to obtain both a forward voltage and a blocking voltage for the switching diodes by means of a potential divider. To supply the required forward current for the switching diodes such a potential divider must in addition have a low-resistance which causes a great loss of energy.

A further solution is to apply the available voltage as desired to the cathodes, or the anodes of the switching diodes and thus switch them in the cut off or pass direction. It is, however, a drawback that the switching diodes cannot be directly connected to the circuit inductors which are usually at a fixed DC potential. Particularly at high frequencies in the VHF or UHF ranges such as are used for television reception, it is important for avoiding parasitic capacitances that at least one electrode of the switching diodes is connected to the resonant circuit elements without the interposition of additional components.

In a tuning circuit arrangement of the kind described in the preamble the drawbacks described are obviated and a satisfactory switching of the switching diodes is obtained without additional cost, if according to the invention a switching voltage supplied by a DC voltage source and keeping the switching diodes in a conducting condition is applied to the said switching diodes only in the first-mentioned switching condition, and in the other condition the blocking voltage for the switching diodes of the resonant circuits which can be tuned to the signal frequencies and of the oscillator circuit is generated by rectification of the local oscillator oscillation, the switching diode of the oscillator circuit serving as a rectifier diode.

It is to be noted that it is know per se to connect a diode to the inductor of an oscillator circuit through a small capacitor, which diode blocks itself due to detecting action and in which the direct current flowing through the diode is varied externally. As a result the tuning of the oscillator is varied as a function of the direct current. In this known circuit arrangement the object is to provide an electronic tuning with the aid of a normal diode which has substantially no reactance. One the other hand, the object of the present invention is to obtain the range changing of the oscillator circuit and of the further resonant circuits of a tuning circuit arrangement without a switching voltage having a plurality of polarities being required for that purpose.

In order that the invention may be readily carried into effect, it will now be described in detail, by way of example, with reference to the accompanying diagrammatic drawing.

The FIGURE shows a tuning circuit arrangement for the reception of electrical signals in the VHF television bands I and III. The tuning unit is accommodated in a metal screening 20. The received signals are applied to an input terminal 21 and from this terminal through a preselective circuit 22, a preamplifier stage 23 and a band-pass filter 24. To a mixer stage 25 oscillations of a local oscillator to be described hereinafter are also applied through a capacitor 26 to the mixer stage 25. The intermediate frequency signal formed by the mixer stage is derived through an output terminal 27.

The local oscillator includes a transistor 1 of the type AF 139 or AF 240. The series arrangement of two inductors 2 and 3 is included between the collector of this transistor and earth, with which inductors a varicap diode 4 of the type BA 138 or BB 105 in series with an isolation capacitor 5 of, for example, 10 pf. is connected in parallel. A bias voltage is applied from a point A to the junction of the varicap diode 4 and the capacitor 5 by which voltage the capacitance of the varicap diode is varied and by which consequently the resonant circuit 2, 3, 4, 5 can be tuned to a desired frequency. The bias voltage of point A is also applied through a resistor 28 to varicap diode 29 of the preselective circuit 22 and through resistors 30 and 31 to two varicap diodes 32 and 33 of the band-pass filter 24. In this manner the tuning of the preselective circuit 22 and the band-pass filter 24 tracks with the tuning of the local oscillator. The base of the transistor 1 is connected to earth through a bypass capacitory 6 of 680 pf. and the base bias is provided by a potentiometer which is connected between the positive terminal (+) of a supply voltage source and the earthed negative terminal which potentiometer consists of a resistor 7 of 1.5 kΩ and a resistor 8 of 5.6 kΩ. The emitter of the transistor 1 is connected through a resistor 9 to the positive terminal (+) of the supply voltage source. The oscillator is fed back in know manner through a capacitor 10 of 1.2 pf. between collector and emitter and can therefore oscillate at the frequency determined by the resonant circuit 2, 3, 4, 5.

For the range changing between the VHF television bands I and III the junction of the inductors 2 and 3 is connected to the cathode of a switching diode 12 to the anode of which a switching voltage S may be applied through a resistor 45 and a line 44 and which anode is furthermore connected to earth through a capacitor 13 of 680 pf. for the suppression of high frequency voltages, and to the base of the transistor 1 through a capacitor 14 of 680 pf. The preselection circuit 22 and the circuits of the band-pass filter 24 likewise include switching diodes 35, 38 and 39 which serve for the range changing of these circuits. The cathodes of these switching diodes are connected to earth with respect to DC voltage through the associated circuit inductors, while the anodes of the switching diodes 35, 38 and 39 are connected to the line 44 through resistors 34, 36 and 37, respectively. If a positive switching voltage S is applied to the supply line 44 a current flows in the pass direction through the switching diodes 12, 35, 38 and 39 which thus obtain a very low resistance and consequently short circuit the associated inductor. Only the inductor 3 is then operative in the resonant circuit of the oscillator and oscillations of higher frequencies for tuning to the VHF television band III are generated by the oscillator. The switching diodes 35, 38 and 39 short circuit in a corresponding manner parts of the active inductors of the preselection circuit and the band-pass filter circuits, so that these circuits are likewise adjusted for tuning in the VHF television band III. For the reception of the other range (VHF TV band I) it is not sufficient to operate the switching diodes without blocking voltage since the diodes without blocking voltage form a not very high and in addition a strong nonlinear resistance so that the oscillatory circuits are strongly damped while in addition the oscillations are greatly distorted.

According to the invention the blocking voltage required for blocking the switching diodes 12, 35, 38 and 39 is generated by rectification of the oscillator voltage, said blocking voltage only dropping out is the positive switching voltage S is applied. The switching diode 12 itself serves as a rectifier diode for rectifying the oscillator voltage. To this end the DC voltage resistance at the anode of the diode 12 must be of very high value for negative DC voltage; then the discharge time constant of the capacitors 13 and 14 connected to this anode is very high so that an extreme peak rectification of the oscillator voltage occurs, the switching diode 12 conveying current only during the extreme peaks of the oscillator voltage. Consequently, the diode 12 is cut off for substantially the entire period of oscillation and the oscillator is only very little damped by the diode 12. The blocking voltage generated by the diode 12 is also applied through line 44 and resistors 34, 36 and 37 to the remaining switching diodes which serve for the range changing so that also these switching diodes are adjusted in the cutoff direction. Since such switching diodes only have a slight blocking current in the order of 1 $\mu$ a. the oscillator circuit is not inadmissibly loaded. Otherwise this load only occurs if the oscillator oscillates at the lower frequencies. (VHF band I) and hence oscillates in a more stable manner. In the range of higher frequencies (VHF band III) the diode 12 as well as the remaining switching diodes 35, 38 and 39 form a short circuit so that the oscillator circuit is not loaded.

If the circuit arrangement described is put into operation without a positive switching voltage S there is still no blocking voltage for the diode 12 and this then forms a proportionally low resistance in order of 2 and 3 kΩ. This causes a considerably damping of the oscillator circuit and the possibility exists that the oscillator will not start under these circumstances. Therefore the oscillator should be constructed in such manner that it will start also without bias on the diode 12. This may, for example, be obtained by providing a sufficiently large feedback, for example, a sufficiently large capacitor 10; a further possibility is to provide an additional feedback which is effective in case of missing bias on the diode 12 and which becomes ineffective if the normal operating condition is reached. For example upon lack of any switching voltage the feedback capacitor 10 may be enlarged with the aid of additional switching diodes which are controlled by the switching voltage of the diode 12.

A simpler solution is shown in the FIGURE. In this FIGURE a capacitor 19 is provided between the emitter and the base of the transistor 1, which capacitor is chosen to be so large that it forms a resonant circuit together with the inductive emitter-base input impedance of the transistor, which resonant circuit is preferably in resonance at a frequency outside the tuning ranges, particularly at a frequency between the tuning ranges. As a result the emitter input acquires a considerably higher resistance for this frequency and since the emitter-base transistor input lies in the circuit thus formed, current transformation and hence a corresponding stronger control of the transistor is obtained for the oscillations applied across the feedback capacitor 10. As a result of this amplified control oscillation occurs if the circuit 2, 3, 4, 5 is strongly damped due to lack of bias on the diode 12. The oscillations thus obtained only serve to feed the diode 12 for generating the blocking voltage. As soon as the diode 12 is cut off due to setting up this blocking voltage the resonant circuit 2, 3, 4, 5 is undamped and the generated oscillation frequency changes over to the desired value adjusted with the aid of the varicap diode 4. Further rectification and maintenance of the blocking voltage is effected in the normal manner already described. Since the resonant circuit formed by the capacitor 19 and the inductive input impedance is no longer in resonance with the frequency at which the emitter input of the transistor is controlled, the control of the transistor at the valve adjusted by other means, particularly the capacitor 10 together with the normal transistor input resistor is also reduced.

The switching voltage S to be applied to the switching diodes is preferably stabilized to some extent against supply voltage variations. To this end the circuit arrangement shown includes a stabilization circuit connected to the positive supply voltage which stabilization voltage consists of the series arrangement of a resistor 40 and a Zener diode 41. The stabilized voltage across the Zener diode is applied as a switching voltage S through a switch 42 to the line 44. For the reception of frequencies in one tuning range the switching diodes are therefore held in the pass direction by the positive voltage across Zener diode 41. For the reception in the other tuning range the connection between the Zener diode 41 and the supply line 44 to the anodes of the switching diodes is interrupted with the aid of the switch 42. This supply line is therefore free floating with respect to DC voltage, so that the negative blocking voltage can be set up due to the rectifying action of the diode 12.

In the position of the switch 42 shown the stabilization circuit 40–41 supplies the collective forward currents (approximately 25 ma.) for the switching diodes 12, 35, 38 and 39. If the switch is reversed for reception in the other frequency range this current drops out so that an increase occurs of the current flowing through the Zener diode of the same size. This is a drawback since consequently a Zener diode must be used which can stand a high current. To obviate this drawback an additional load in the form of a resistor 43 is connected when switching off the switching diodes, which resistor 43 is connected when switching off the switching diodes, which resistor has approximately the same current as the collective forward currents of the switching diodes. The current flowing through the Zener diode then has substantially the same small value for both switching conditions.

What is claimed is

1. A tuning circuit arrangement for a receiver comprising frequency selective circuits having electronically tunable resonant circuits to receive signals within either of two preselected separated frequency ranges, a local oscillator having an electronically tunable resonant circuit for producing oscillations at frequency values of predetermined relationship to said received signals within either of said preselected frequency ranges, and means for electronically tuning said resonant circuits including variable capacitance diodes supplies by a control voltage for tuning said circuits within either of said two preselected frequency ranges, comparing switching diodes for shorting portions of said resonant circuits thereby selecting one of said two preselected frequency ranges as determined by the polarity of a biasing potential applied thereto, a bias voltage source, means for applying said source to said switching diodes in a given polarity to render said diodes conductive thereby to operate said resonant circuits at one of said frequency ranges, and means for applying a blocking potential to said diodes upon disconnecting said bias source thereby to operate said tuning circuits within a second frequency range, said latter means comprising the switching diode of said local oscillator coupled to a circuit resonant to signals outside said two preselected frequency ranges for producing by rectification of the oscillator signals outside said preselected frequency ranges a DC voltage of polarity opposite to said bias source.

2. A tuning circuit as claimed in claim 1 wherein said local oscillator comprises means for providing oscillator signals without blocking voltages being produces across said switching diodes whenever said switching diodes are initially disconnected from said single bias source.

3. A tuning circuit as claimed in claim 2 wherein said means for providing oscillation signals without blocking voltages being produces across said switching diodes when said switching diodes are initially disconnected from said single bias source comprise a resonant feedback circuit for said oscillator causing said oscillator to initially resonate outside of said two preselected frequency ranges, said feedback circuit being substantially ineffective when said oscillator resonates at frequencies within said two preselected ranges.

4. A tuning circuit as claimed in claim 3 wherein said circuit parameters comprise a grounded base transistor and a capacitor connected between emitter and base of said transistor to form a resonant circuit tuned to frequencies outside of said two preselected frequency ranges.